(12) United States Patent
Kim et al.

(10) Patent No.: US 7,908,501 B2
(45) Date of Patent: Mar. 15, 2011

(54) PROGRESSIVE POWER CONTROL OF A MULTI-PORT MEMORY DEVICE

(75) Inventors: Sungjoon Kim, Cupertino, CA (US); Dongyun Lee, San Jose, CA (US); Edward Kim, Palo Alto, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 855 days.

(21) Appl. No.: 11/690,642

(22) Filed: Mar. 23, 2007

(65) Prior Publication Data

US 2008/0235528 A1 Sep. 25, 2008

(51) Int. Cl.
*G06F 1/32* (2006.01)
(52) U.S. Cl. ........ 713/324; 713/322; 713/323; 365/227; 365/230.05
(58) Field of Classification Search .......... 713/322–324; 711/149; 365/227, 229, 230.05
See application file for complete search history.

(56) References Cited

U.S. PATENT DOCUMENTS

| | | | |
|---|---|---|---|
| 5,617,572 A * | 4/1997 | Pearce et al. ............. | 713/323 |
| 5,903,601 A * | 5/1999 | Elnashar et al. ............ | 375/220 |
| 5,987,614 A | 11/1999 | Mitchell et al. | |
| 6,560,160 B1 | 5/2003 | Grace | |
| 2002/0104031 A1 | 8/2002 | Tomlinson et al. | |
| 2003/0120896 A1 | 6/2003 | Gosior et al. | |
| 2004/0107307 A1 | 6/2004 | Hasegawa et al. | |
| 2004/0141404 A1 | 7/2004 | Tsern et al. | |

FOREIGN PATENT DOCUMENTS

| | | |
|---|---|---|
| EP | 0490679 | 6/1992 |
| EP | 1220226 | 7/2002 |

OTHER PUBLICATIONS

International Preliminary Report on Patentability for International Application No. PCT/US2008/57920 mailed Oct. 8, 2009.
International Search Report & Written Opinion for International Application No. PCT/US2008/57920 mailed Sep. 4, 2008.
EPO, Extended European Search Report for European Patent Application No. 08744214.1 mailed Jul. 16, 2010.

\* cited by examiner

*Primary Examiner* — Thuan N Du
(74) *Attorney, Agent, or Firm* — Blakely Sokoloff Taylor & Zafman

(57) ABSTRACT

A method and system for progressively reducing the power consumption of a serial memory device is provided, called the power control system. The power control system monitors the ports of a multi-port serial memory so that they can be enabled or disabled on a per-port basis. When data is not being transmitted or received on a port, a series of steps are taken to progressively de-power portions of the port and cause the port to enter into a low-power state. By disabling certain ports and placing ports in a low-power state, the power consumption of the overall serial port memory is significantly reduced.

30 Claims, 5 Drawing Sheets

PROGRESSIVE POWER CONTROL OF A MULTI-PORT MEMORY DEVICE

BACKGROUND

The communications links across which computers—or parts of computers—talk to one another may be either serial or parallel. A parallel link transmits several streams of data (perhaps representing particular bits of a stream of bytes) along multiple channels (wires, printed circuit tracks, optical fibers, etc.), while a serial link transmits a single stream of data over only two wires (a positive and complementary signal). At first sight it would seem that a serial link must be inferior to a parallel one, because it can transmit less data on each clock tick. However, it is often the case that serial links can be clocked considerably faster than parallel links and can achieve a higher data rate. A number of factors allow serial links to be clocked at a greater rate. First, clock skew between different channels is not an issue (for un-clocked serial links). Second, a serial connection requires fewer interconnecting cables (e.g. wires/fibers) and hence occupies less space allowing for better isolation of the channel from its surroundings. Finally, crosstalk is less of an issue because there are fewer conductors in proximity. In many cases, serial links are a better option because they are less expensive to implement. Many integrated circuits (ICs) have serial interfaces, as opposed to parallel ones, so that they have fewer pins and are therefore more economical.

Despite their advantages, serial links tend to use more power than parallel links. In particular, when transmitting or receiving data, a serial link changes states very rapidly (called toggling). A small amount of power is consumed by each state change, thereby adding up to large power consumption over time. Serial links are also typically terminated on each end by a termination resistor and bias resistors. Without termination resistors, reflections of fast driver edges can cause multiple data edges that can cause data corruption. Termination resistors also reduce electrical noise sensitivity due to the lower impedance. The bias resistors bias the lines apart when the lines are not being driven. Without biasing resistors, the signal falls to zero (where electrical noise sensitivity is greatest) when no data is being transmitted. Both termination and bias resistors are therefore necessary; however, the additional resistance causes the link to consume a constant amount of power to keep the link alive.

Consumers demand higher and higher speeds from electronic devices, but the higher the speed of the device the more power the device consumes. This is particularly a problem for mobile devices that have limited power available through on-board batteries. To provide the most benefit, these devices must have a long battery life while still providing consumers with a high degree of functionality. Previous attempts at power reduction have attempted to power down the device or place it into a lower power state when it is not in use, and then rapidly return it to full power when the user of the device wants to perform a function. However, this technique is not effective when a device is frequently in use and can still result in significant power being consumed.

DETAILED DESCRIPTION

Figure 1:
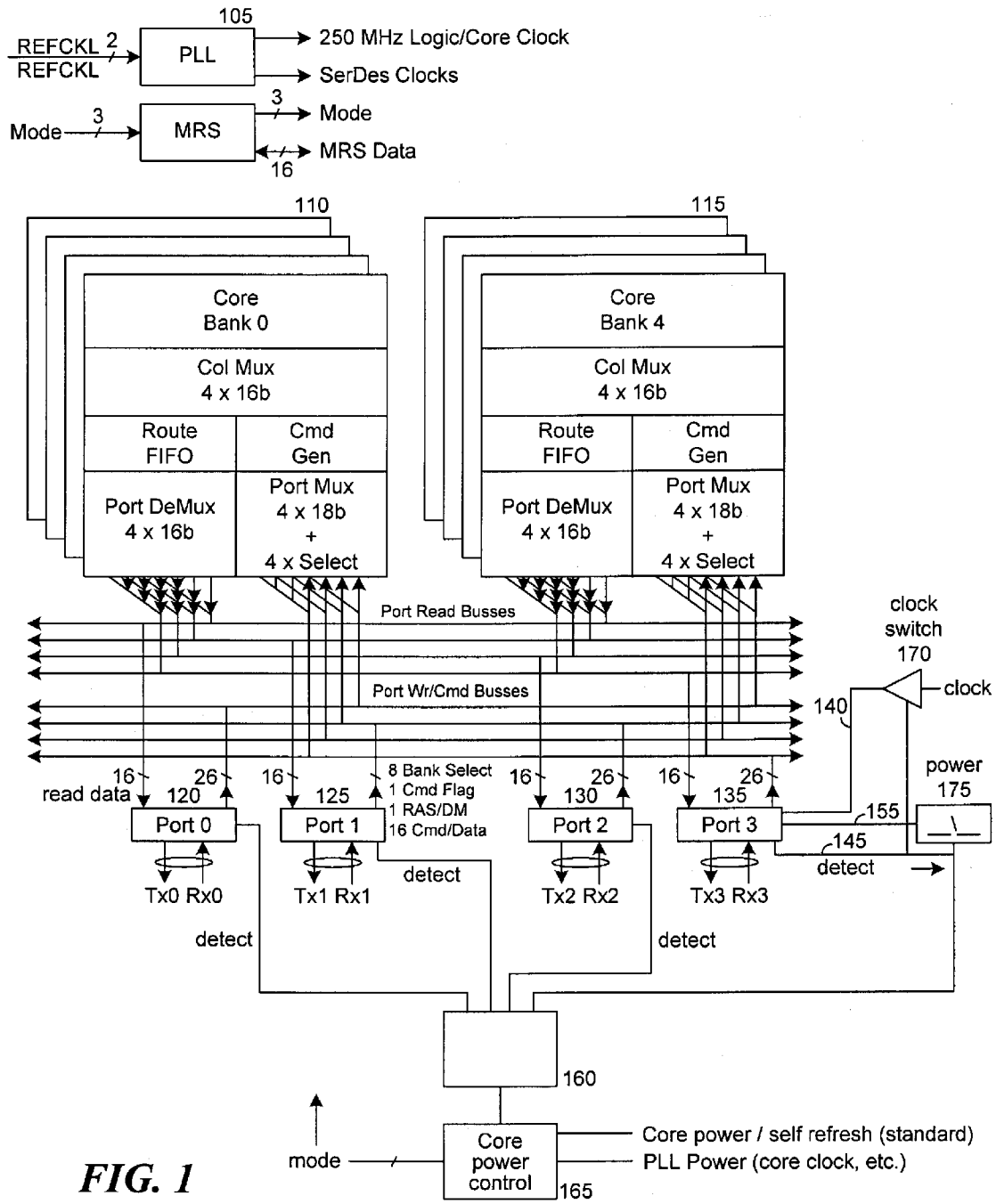
FIG. 1 is a circuit diagram illustrating the components of a power control system in a serial port memory device.

A method and system for progressively reducing the power consumption of a serial memory device is provided (the "power control system"). A multi-port serial memory device is described in U.S. patent application Ser. No. 10/045,297, entitled "COMMUNICATIONS ARCHITECTURE FOR MEMORY-BASED DEVICES,", which is incorporated herein by reference. The power control system configures the ports of a multi-port serial memory so that they can be enabled or disabled on a per-port basis. When data is not being transmitted or received on a port, a series of steps are taken to progressively de-power portions of the port and cause the port to enter into a low-power state. By disabling certain ports and placing ports in a low-power state, the power consumption of the overall serial port memory is significantly reduced. Each port may be connected to a different host that accesses the device. Because ports can be shut down individually, hosts may still access the serial memory to perform certain functions using some ports while other ports are in a low-power state. In this way, the power control system reduces the power consumption of a device progressively, while still making the functionality of the device available for certain accessing hosts.

In some embodiments, the power control system detects that a port is not in use based on a shut-off criteria (e.g., the activity of the port). For example, if the port is not transmitting or receiving, then the power control system will shut the port down. The power control system may wait for the expiration of a timeout based on the last time that data was received by the port to determine that the port is not active. The power control system may also receive a command from the host that indicates that no new data will be transmitted for a period, and the power control system may shut down the port in response to the command.

In some embodiments, the power control system removes the port clock signal and power for a shut down port. The port clock switches rapidly and consumes power that is not needed when the port is not in use. By removing the port clock and power to a port, the power control system further reduces power consumption. When the port is needed again, the power and the clock signal can be reapplied and the port returned to an operational state. For example, when powered down the power control system may detect a change in the signal state on the line that indicates that the port is needed again by a host. Upon detecting the change in signal state, the power control system powers the port back up by reversing the steps taken to power the port down.

In some embodiments, if all ports are shut down, then the power control system lowers the core power including the clock generator and PLL to further reduce power consumption. The core power supplies each of the ports as well as common support circuitry. By removing the core power, the power control system achieves additional power savings. Since the clock generator and PLL can often consume a significant amount of power required by a circuit, shutting down the clock generator and PLL can result in significant power savings.

In some embodiments, the power control system shuts down ports by removing termination at the port. The port is placed into common mode so that the voltage of the positive and complementary signals is the same. Removing the termination reduces power consumed. Moreover, neither the host nor the memory device is transmitting when a port is shut down, so both the host and memory device save power.

FIG. 1 is a circuit diagram illustrating the components of the power control system and the serial memory device in one embodiment. The serial memory device contains a phase-locked loop (PLL) 105, multiple banks of memory 110 and 115, four ports 120, 125, 130, and 135, a clock line 140 for each port, and a power line 155 for each port. The multiple banks of memory 110 and 115 are coupled to the four serial ports 120, 125, 130, and 135, thereby making the banks of memory accessible by one or more host devices that are connected to the ports. While the memory device is depicted as having only eight banks in two groups of four and four ports in FIG. 1, the memory device may have any number of banks and ports. The number of banks and ports are typically determined by the number of accessing hosts and the particular application for which the memory device is being used. The power control system comprises an activity detection line 145, a clock switch 170, and a power switch 175 for each port, as well as power control logic 160, and a core power control module 165. The activity detection line 145 for each port is coupled to the clock switch 170, the power switch 175, and the power control logic 160. In some embodiments, the power control logic performs a logical AND operation on the activity detection line from each of the ports. The output from the power control logic 160 is coupled to the power control module 165. While FIG. 1 depicts a certain switch configuration and power control logic, it will be appreciated that other configurations and constructions may perform similar functions to achieve the same result. For example, the power control logic may be implemented in software rather than in hardware, and the control signals used to trigger the power switch and the clock switch may be received from a central controller. As another example, the power control logic may be more complex depending on the number of ports that are contained in the memory device.

A variety of power-saving techniques are implemented by the power control system in order to minimize the power consumption of the serial memory device. An activity detection line 145 is coupled to each port of the memory device, and carries a signal indicating when the port is active and when the port is inactive. The signal on the activity detection line is used to trigger various power-saving modes. For example, when the signal on the activity detection line indicates that a port is inactive, the power on power line 155 is disconnected from the port by switching off the power switch 175. Removing power from the port reduces the power consumption of the memory device. As another example, when a port is inactive the clock signal on clock line 140 is disabled for the port by switching off the clock switch 170. Shifting down the clock for the port reduces toggling and associated power consumption. As still another example, if power control logic 160 detects from the signal on the activity detection lines that all of the device ports are inactive, the power control logic signals the core power control module 165. Upon receiving the signal that all ports are inactive, the core power control module may further reduce power consumption by shutting down the core clock (not shown) and power to the PLL 105. Removing the clock signal and power to each port, or shutting down the core clock and power to the PLL, may be done immediately after a port is detected to be inactive, or after the expiration of a timeout period. The timeout period may vary in length for each port, for all ports, based on the application in which the memory device is being used, etc.

Figure 2:
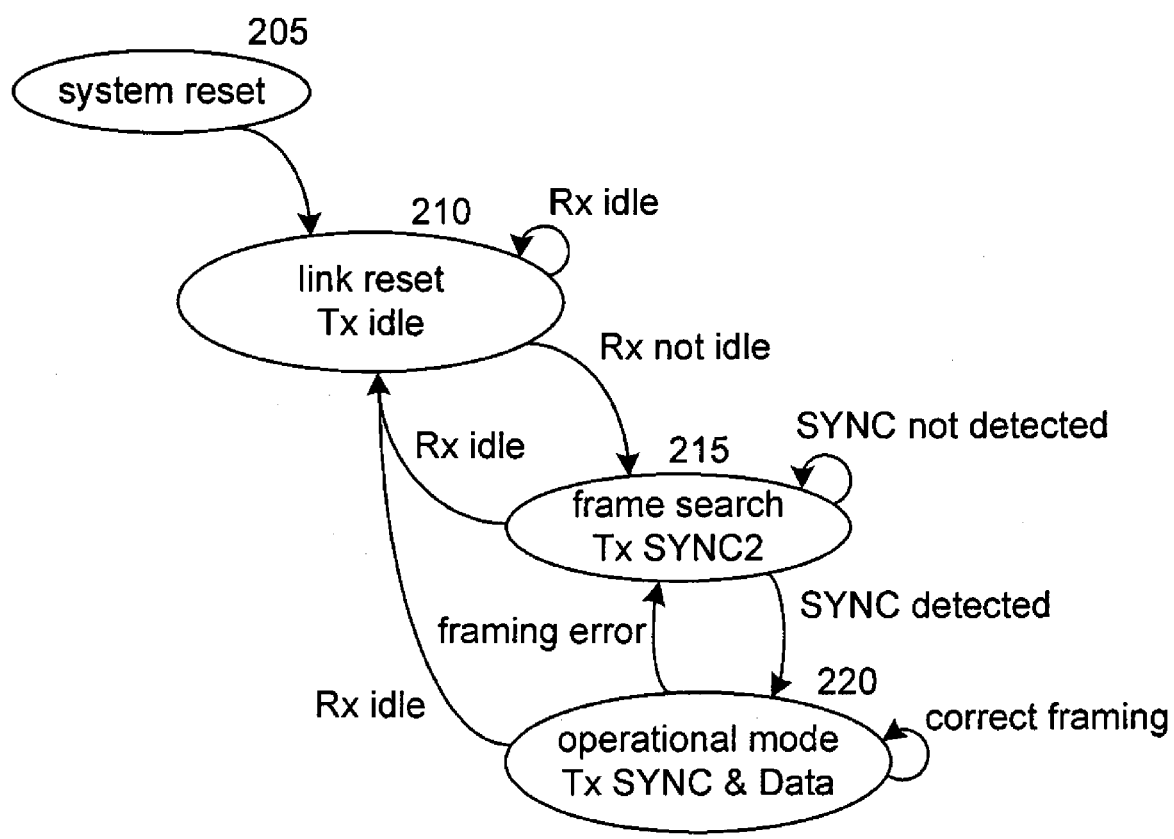
FIG. 2 is a state machine that illustrates the states of a single port of the serial port memory device.

FIG. 2 is a state machine that illustrates the states of a single port of a serial port memory device. When the port is first activated, the port is in a system reset state 205. The port then moves to a link reset state 210. As long as no data signal is being received on the port, the port remains in this state. In the link reset state 210, the port is not driven, and the voltage of the positive and complementary lines is the same due to termination. In order to minimize power, the clock and power to the port may also be removed as described above. When a signal is received on the port, the port moves to a frame search state 215. If the power and/or clock to the port are off when a signal is received, then the power and/or clock are turned back on. In the frame search state 215, the port is driven and the positive and complementary lines carry complementary signals. The port waits for a SYNC message from the host and transmits a SYNC2 message to the host. If the port stops receiving a signal, the port returns to the link reset state 210. If a SYNC message is detected from the host, then the port moves to an operational mode state 220. In the operational mode state 220, data is sent and received from the host. If the port stops receiving data, then the port can be powered down and returns to the link reset state 210. If any errors are detected during transmission, the port returns to the frame search state 215 to resynchronize with the host.

Figure 3:
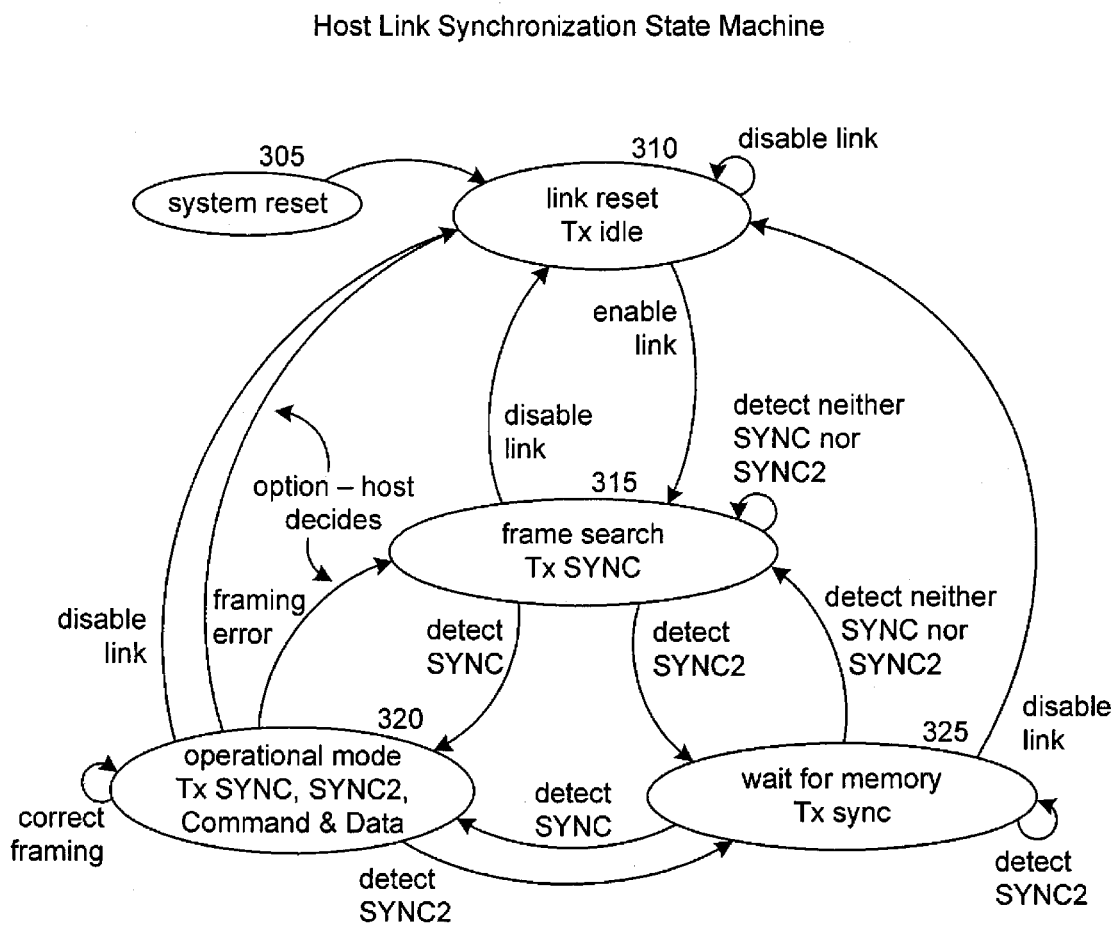
FIG. 3 is a state machine that illustrates the states of a host attached to a single port of the serial port memory device.

FIG. 3 is a state machine that illustrates the states of a host attached to a single port of a serial port memory device. When the host is first activated, the host is in a system reset state 305. The host then moves to a link reset state 310. As long as nothing is being sent, the host remains in this state. In the link reset state 310, the link is not terminated, and the voltage of the positive and complementary lines is the same (i.e., the lines are in squelch mode). When the host wants to send additional data, the host moves to a frame search state 315. In the frame search state 315, the link is terminated and the positive and complementary lines carry complementary signals. The host waits for a SYNC2 message from the port and transmits a SYNC message to the port. If the host decides to disable the link (e.g., by a timeout expiring or error parity), then the host returns to the link reset state 310. If a SYNC message is detected from the port, then the host moves to an operational mode state 320, else if a SYNC2 message is received, then the host waits for a SYNC message from the port. In the operational mode state 320, data is sent and received to the port. If at any point the host detects that the port is disabled, then the link can be powered down and the host returns to the link reset state 310. If any errors are detected during transmission, the host also returns to the link reset state 310 to resynchronize with the port.

In some embodiments, the serial port memory may implement additional power saving modes at the bank level. For example, it is not necessary to refresh banks with no data in them. Refreshing banks consumes power, so avoiding a refresh of a bank saves power. In some embodiments, the serial port memory has four power-down modes, described as follows.

Self-refresh—To enter the self-refresh mode, all ports are set by the power control system to idle state with no banks active. The PLL 105 is stopped, and the external reference clock (not shown) may be stopped. All other clocks are gated off to save power. All peripheral circuitry is disabled to save power as well. All banks are precharged before entering this mode. The core provides its own refresh timing, so this mode can be sustained indefinitely. The reference clock should be stable before exiting this mode. Links are retrained after exiting this mode.

Precharge Power Down—To enter the precharge power down mode, all ports are set by the power control system to idle state with no banks active. The PLL 105 is stopped, and the reference clock (not shown) may be stopped. All other clocks are gated off to save power. All peripheral circuitry is disabled to save power as well. All banks are precharged before entering this mode. No other operations are performed, so this mode should be exited before the next refresh cycle. The reference clock should be stable before exiting this mode. Links are retrained after exiting this mode.

Active Power Down—To enter the active power down mode, all ports are set by the power control system to idle state with some banks active. The PLL 105 continues to run, and the reference clock remains stable. All peripheral circuitry is disabled to save power. No other operations are performed, so this mode should be exited before the next refresh cycle. Links are retrained after exiting this mode.

Idle—When a link enters idle state, that link ceases to use power. The link is retrained when the link is brought back up.

Figure 4:
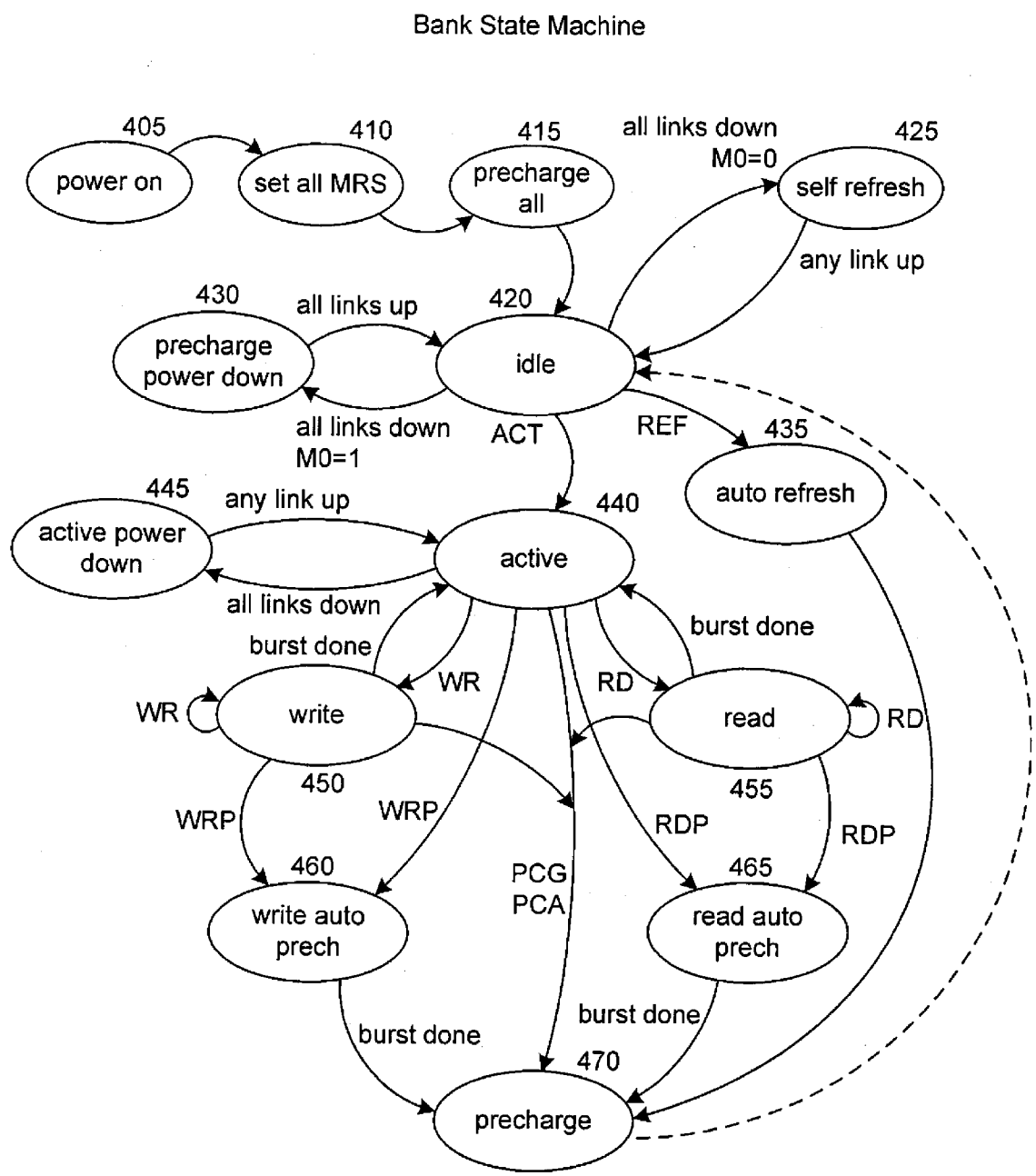
FIG. 4 is a state diagram illustrating the power-down modes available to each bank of the serial port memory device.

FIG. 4 is a state diagram illustrating the power-down modes available to each bank in some embodiments. The bank is initially in a power on state 405. The bank then moves to a set all MRS state 410. In the set all MRS state 410 each component is sent a reset indication. The bank then moves to a precharge all state 415. In the precharge all state 415, the dynamic random access memory (DRAM) that composes the bank is precharged. The bank then moves to an idle state 420. If any link is active, then the bank moves to a self-refresh state 425, described above. If all links are inactive, the bank moves to a precharge power down state 430, also described above. If a refresh message (REF) is received while in the idle state, then the bank moves from the idle state to an auto refresh state 435 and to a precharge state 470. If an activation message (ACT) is received while in the idle state, then the bank moves from the idle state 420 to an active state 440. From the active state 440, if all links are down, then the bank moves to an active power down state 445, described above. From the active state 440, reads and writes are processed. When a read is received, the bank moves to a read state 455, and/or to a read auto precharge state 465. When a write is received, the bank moves to a write state 450 and/or to a write auto precharge state 460. When the read or write is complete, the bank moves to a precharge state 470, and then back to the idle state 420. The bank continues this cycle until power is removed.

Figure 5:
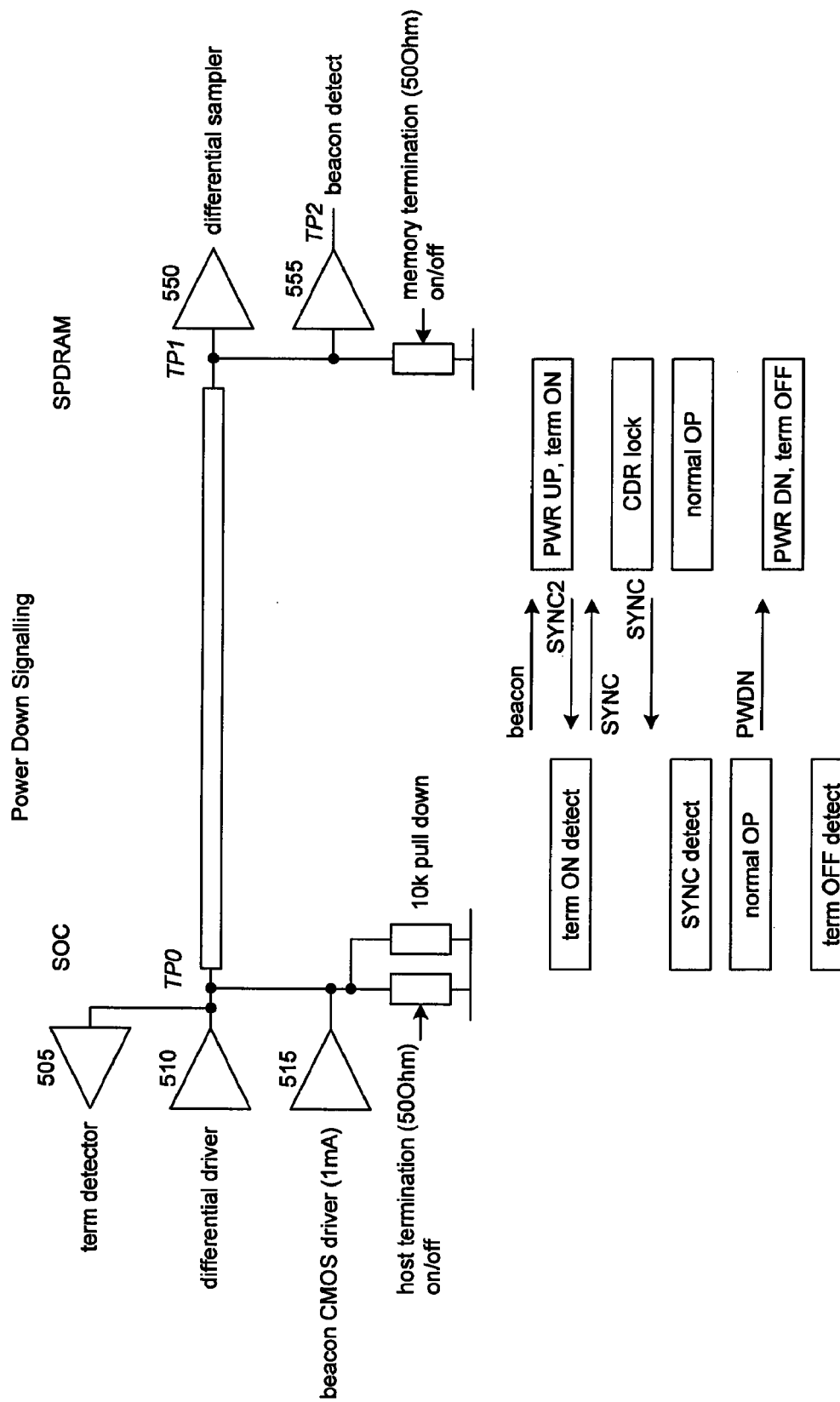
FIG. 5 is a circuit diagram that illustrates the termination of a serial link attached to a port.

FIG. 5 is a circuit diagram that illustrates the termination of the serial link. The host side of the link contains a termination detector 505, a differential driver 510, a beacon driver 515, and a termination circuit 520. The termination detector 505 detects when termination is in effect on the memory side of the link. The differential driver 510 drives a differential signal over the positive and complementary lines of the serial link. The beacon driver 515 signals the memory side of the link that data is about to be transmitted so that the memory side of the link can engage the termination circuit 560. The memory side of the serial link contains a differential sampler 550, a beacon detector 555, and a termination circuit 560. The differential sampler 550 detects a differential voltage signal on the serial link. The beacon detector 555 detects the beacon signal sent by the beacon driver 515. The termination circuit 560 terminates the link when the link is active. The termination resistor can be off when the link is inactive and on when the link is active.

The power control system can be used in a variety of environments such as memory devices or other environments that use serial memory. The power control system is particularly applicable to low-power applications such as cell phones, digital cameras, and other devices where battery life and power consumption are important concerns.

From the foregoing, it will be appreciated that specific embodiments of the power control system have been described herein for purposes of illustration, but that various modifications may be made without deviating from the spirit and scope of the invention. Accordingly, the invention is not limited except as by the appended claims.

We claim:

1. A method of reducing power consumption in a multi-port memory device having a plurality of serial ports, the method comprising:
    monitoring a transmission and reception of data on a plurality of serial ports in a memory device using an activity detection line coupled to each serial port of the plurality of serial ports;
    determining if any serial port of the plurality of serial ports is inactive based, at least in part, on the activity detection line;
    for each of the monitored plurality of serial ports, detecting when a shut-off criteria is satisfied at the serial port, the shut-off criteria based, at least in part, on a period of inactivity of the serial port; and
    when the shut-off criteria is satisfied at a first serial port of the plurality of serial ports, powering down the first serial port without affecting the operation of the plurality of other serial ports of the memory device.

2. The method of claim 1 wherein powering down the first serial port comprises removing termination from the first serial port.

3. The method of claim 1 wherein powering down the first serial port comprises removing the clock signal from the first serial port.

4. The method of claim 1 wherein powering down the first serial port comprises removing power from the first serial port.

5. The method of claim 1 further comprising providing an indication to a core power controller that the first serial port is powered down.

6. The method of claim 1 further comprising upon detecting a transmission to a serial port of the plurality of serial ports that has been powered down, selectively powering up the serial port to receive the transmission.

7. The method of claim 1 further comprising detecting a differential voltage applied to a serial port of the plurality of serial ports than has been powered down, and upon detecting the differential voltage, powering up the serial port.

8. The method of claim 1 further comprising detecting when data transmission and reception has ceased for all of the plurality of serial ports of the memory device for a threshold period.

9. The method of claim 8 further comprising, when data transmission and reception has ceased for all of the plurality of serial ports of the memory device for the threshold period, switching off core power to the memory device.

10. The method of claim 8 further comprising, when data transmission and reception has ceased for all of the plurality of serial ports of the memory device for the threshold period, switching off a clock generator to the memory device.

11. The method of claim 1 wherein the first serial port and a second serial port of the plurality of serial ports operate at different speeds.

12. The method of claim 1 wherein the plurality of serial ports are each connected to a different host.

13. The method of claim 1 wherein a clock for operating each of the plurality of serial ports of the memory device is provided by a phased-locked loop.

14. The method of claim 1 wherein each of the plurality of serial ports is coupled to one of a plurality of memory banks of the memory device.

15. The method of claim 1 wherein the shut-off criteria is the expiration of a timeout.

16. The method of claim 15 wherein the timeout is based on a time since a last data packet was received.

17. The method of claim 1 wherein the shut-off criteria is a command received from a host.

18. The method of claim 1 wherein detecting when a shut-off criteria is satisfied at a serial port comprises detecting when the port is idle.

19. The method of claim 1 further comprising:
    detecting when a power-on criteria is satisfied at a powered down serial port; and
    when the power-on criteria is satisfied at the powered down serial port, powering up the serial port without affecting the operation of the plurality of other serial ports of the memory device.

20. A power control system for progressively reducing the power consumption of a memory device having a plurality of serial ports, comprising:
    a port activity detection component configured to detect the activity of each of a plurality of serial ports of the memory device, the port activity detection component to determine if a serial port of the plurality of serial ports is inactive, the port activity detection component to determine if a shut-off criteria for the serial port is satisfied based, at least in part, on inactivity of the serial port;
    a port power-down component coupled to the port activity detection component and configured to selectively power down the serial port of the memory device based on the shut-off criteria; and
    a core power-down component coupled to the port activity detection component and configured to power down core circuitry of the serial port memory device in response to detected lack of activity on all of the plurality of serial ports.

21. The system of claim 20 wherein powering down the serial port comprises removing termination from the serial port.

22. The system of claim 20 wherein powering down the serial port comprises removing the clock signal from the serial port.

23. The system of claim 20 wherein powering down the serial port comprises removing power from the serial port.

24. The system of claim 20 wherein the port power-down component powers down the serial port when no activity associated with the serial port is detected.

25. The system of claim 20 wherein the port power-down component powers down the serial port when no activity is detected for more than a timeout period.

26. The system of claim 20 wherein the core circuitry is circuitry that provides core power to the memory device.

27. The system of claim 20 wherein the core circuitry is the clock generator to the memory device.

28. The system of claim 20 including a port power-up component coupled to the port activity detection component and configured to selectively power up a powered down serial port of the memory device based on the detected activity of the powered down serial port.

29. The system of claim 20 wherein the system is an ASIC.

30. The system of claim 20 wherein the system is packaged with the memory device.

* * * * *